United States Patent
Frantzeskakis et al.

(10) Patent No.: US 7,869,541 B2
(45) Date of Patent: Jan. 11, 2011

(54) METHOD AND SYSTEM FOR DIRECT AND POLAR MODULATION USING A TWO INPUT PLL

(75) Inventors: Emmanouil Frantzeskakis, Ilioupolis (GR); Georgios Sfikas, Glyfada (GR)

(73) Assignee: Broadcom Corporation, Irvine, CA (US)

( * ) Notice: Subject to any disclaimer, the term of this patent is extended or adjusted under 35 U.S.C. 154(b) by 997 days.

(21) Appl. No.: 11/561,093

(22) Filed: Nov. 17, 2006

(65) Prior Publication Data

US 2008/0116986 A1 May 22, 2008

(51) Int. Cl.
*H04L 25/03* (2006.01)
(52) U.S. Cl. .................. 375/296; 375/295; 375/297; 375/376; 332/100; 332/127; 332/144; 332/159; 332/161; 327/156; 455/114.3
(58) Field of Classification Search .......... 375/295, 375/296, 297; 455/91, 114.3; 330/149
See application file for complete search history.

(56) References Cited

U.S. PATENT DOCUMENTS

| | | | |
|---|---|---|---|
| 5,983,077 | A | 11/1999 | Dent |
| 7,346,122 | B1 * | 3/2008 | Cao ............... 375/296 |
| 2004/0125904 | A1 | 7/2004 | Sofianos et al. |
| 2005/0041755 | A1 | 2/2005 | Hammes |
| 2005/0073369 | A1 | 4/2005 | Balboni et al. |
| 2005/0129142 | A1 | 6/2005 | Yellin et al. |
| 2005/0185749 | A1 | 8/2005 | Convent et al. |
| 2005/0285688 | A1 | 12/2005 | Hirano et al. |
| 2007/0036238 | A1 * | 2/2007 | Matero et al. ........... 375/296 |
| 2007/0286107 | A1 * | 12/2007 | Singh et al. ............ 370/312 |

OTHER PUBLICATIONS

European Search Report corresponding to European Patent Application Serial No. 07013040.6-1233, mailed Aug. 11, 2008, 3 pages.

* cited by examiner

*Primary Examiner*—David C Payne
*Assistant Examiner*—Leon Flores
(74) *Attorney, Agent, or Firm*—McAndrews, Held & Malloy, Ltd.

(57) ABSTRACT

Aspects of a method and system for direct and polar modulation using a two input PLL are presented. Aspects of the system may include generating digital signals $W_n$ and $V_n$ from an input data signal $U_n$ and a feedback signal $Y_n$. The generated digital signals $W_n$ and $V_n$ combined may carry the information content of $U_n$ while they compensate the non-idealities of the two-input analog phase locked loop (PLL). The digital signal $W_n$, which may be scaled appropriately in frequency, and the digital signal $V_n$ may be provided as inputs to the PLL. The feedback signal $Y_n$ may be a digital signal that may correspond to the analog feedback signal $P_t$ that may be generated by the PLL. Accordingly, the PLL may be adaptively controlled via the digital signals $W_n$ and $V_n$ for properly transmitting the input data signal $U_n$.

28 Claims, 9 Drawing Sheets

METHOD AND SYSTEM FOR DIRECT AND POLAR MODULATION USING A TWO INPUT PLL

CROSS-REFERENCE TO RELATED APPLICATIONS/INCORPORATION BY REFERENCE

This application makes reference to: U.S. patent application Ser. No. 11/552,181 filed on Oct. 24, 2006.

The above stated application is hereby incorporated herein by reference in its entirety.

FIELD OF THE INVENTION

Certain embodiments of the invention relate to wireless communication. More specifically, certain embodiments of the invention relate to a method and system for direct and polar modulation using a two input PLL.

BACKGROUND OF THE INVENTION

Mobile communications have changed the way people communicate and mobile phones have been transformed from a luxury item to an essential part of every day life. The use of mobile phones today is dictated by social situations, rather than hampered by location or technology. While voice connections fulfill the basic need to communicate, and wireless voice and data connections continue to filter even further into the fabric of every day life, various integrated mobile multimedia applications, utilizing wireless and/or wired networks, may be the next step in the mobile communication revolution.

Third generation (3G) cellular networks offering various high speed access technologies and mobile telephones that have been specifically designed to utilize these technologies, fulfill demands for integrated multimedia applications supporting TV and audio applications utilizing advanced compression standards, high-resolution gaming applications, musical interfaces, peripheral interface support, etc. The processing requirements are being increased as chip designers take advantage of compression and higher bandwidths to transmit more information. 3G wireless applications support bit rates from 384 kilobits (Kbits)/second to 2 megabits (Mbits)/second, allowing chip designers to provide wireless systems with multimedia capabilities, superior quality, reduced interference, and a wider coverage area.

As mobile multimedia services grow in popularity and usage, factors such as power consumption, cost efficient optimization of network capacity and quality of service (QoS) continue to be even more essential to cellular operators than it is today. These factors may be achieved with careful network planning and operation, improvements in transmission methods, and advances in receiver techniques and chip integration solutions. To this end, carriers need technologies that will allow them to increase downlink throughput for the mobile multimedia applications support and, in turn, offer advanced QoS capabilities and speeds for consumers of mobile multimedia application services. Currently, mobile multimedia processors may not fully utilize system-on-a-chip (SoC) integration for advanced total system solution for today's mobile handsets. For example, conventional mobile processors may utilize a plurality of hardware accelerators to enable a variety of multimedia applications, which significantly increases power consumption, implementation complexity, mobile processor real estate, and ultimately terminal size.

Some mobile communications technologies, for example the global system for mobile communications (GSM), general packet radio service (GPRS), and enhanced data rates for GSM evolution (EDGE) may utilize polar modulation. Polar modulation may comprise converting a signal from a representation that utilizes in-phase (I), and quadrature phase (Q) components, to a corresponding representation that utilizes magnitude ($\rho$) and phase ($\phi$) components. Quantization noise may be introduced as a result of the conversion from the I and Q signal representation to the $\rho$ and $\phi$ signal representation. Consequently, at least a portion of the components in the $\rho$ and $\phi$ signal representation may be filtered.

There are numerous existing integrated circuit (IC) designs for direct modulation and/or polar modulation transmitters that are based on fractional-N phase locked loop (PLL) and/or sigma delta modulation techniques. Many of these IC designs comprise mixed analog and digital signals for which CMOS technology may be a semiconductor fabrication technology of choice for maintaining low power consumption and manufacturing cost. However, variations in component parameter values introduced during IC manufacturing, and temperature variations introduced during circuit operation may require that analog component values be adjustable, or tunable, to control component behavior. A particular area of concern is a low pass filtering characteristic that is typical in many PLL designs. This may pose a particular problem when a cutoff frequency of the low pass filter is within the range of frequencies utilized by a direct modulation and/or polar modulation transmitter for transmitting signals. As a result, an input signal that is being modulated by the direct modulation or polar modulation transmitter may become distorted. In turn, the modulation output signal may become distorted. The result is that the transmitted signal, when received at a receiver device, may not present a faithful reproduction of the original input signal that was submitted for transmission.

In some existing direct modulation and/or polar modulation transmitters, analog component values in PLL circuitry may be tunable by utilizing analog control circuitry. However, one limitation of the use of analog control circuitry to control analog PLL circuitry may involve mismatches between components in the analog PLL circuitry and components in the analog control circuitry. A limitation associated with the use of such circuitry in polar modulation transmitters may involve the introduction of timing misalignment between a phase signal path, and an amplitude signal path utilized for the input signals to the polar modulation transmitter.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A method and system for direct and polar modulation using a two input PLL, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention relate to a method and system for direct and polar modulation using a two input PLL. Aspects of the method may comprise generating digital signals $W_n$ and $V_n$ from an input data signal $U_n$ and a feedback signal $Y_n$. The generated digital signals $W_n$ and $V_n$ may carry the information content of the input data signal $U_n$ while also compensating for the non-idealities of the two-input analog phase locked loop (PLL). The digital signal $W_n$, which may be scaled appropriately in frequency, and the digital signal $V_n$ may be provided as inputs to the PLL. The feedback signal $Y_n$ may be a digital signal that may correspond to the analog feedback signal $P_t$ that may be generated by the PLL. Accordingly, the PLL may be adaptively controlled for properly transmitting the input data signal $U_n$.

Figure 1:
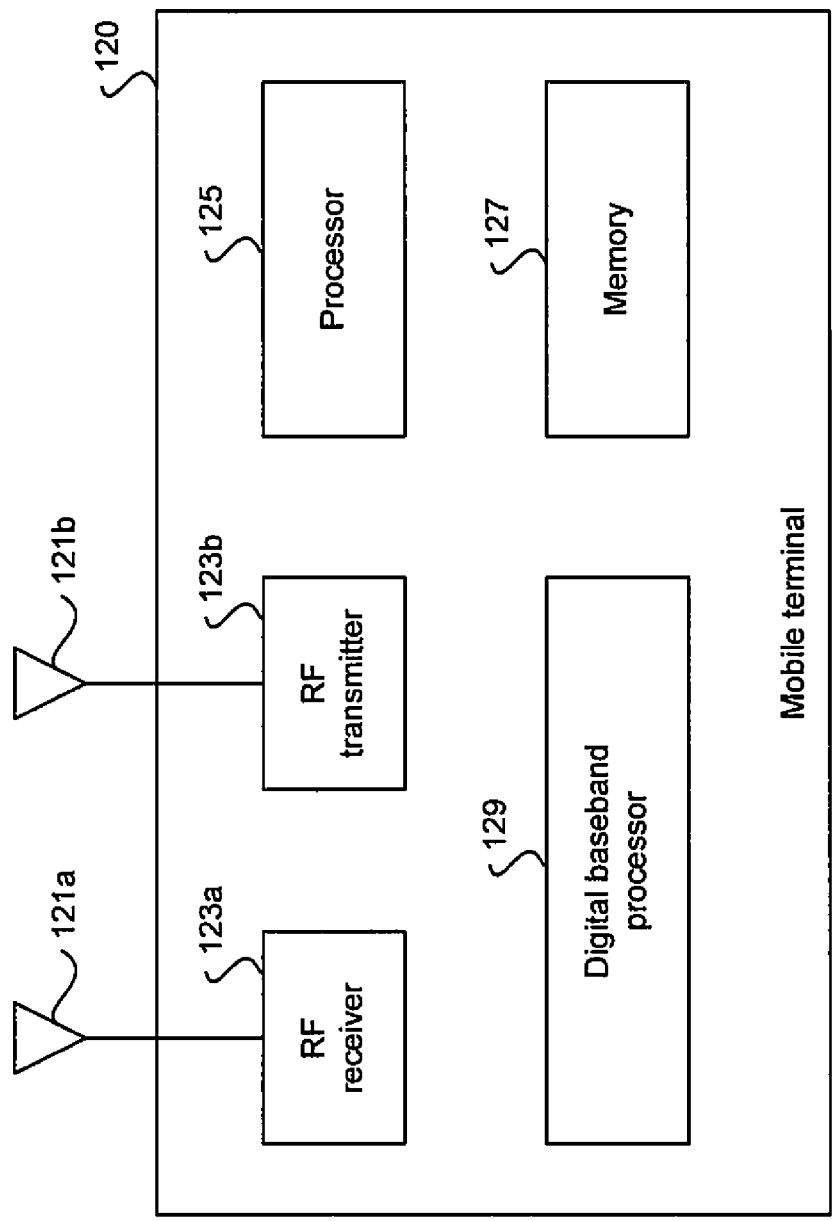
FIG. 1 is a block diagram illustrating an exemplary mobile terminal, in accordance with an embodiment of the invention.

FIG. 1 is a block diagram illustrating an exemplary mobile terminal, in accordance with an embodiment of the invention. Referring to FIG. 1, there is shown a mobile terminal 120 that may comprise a radio frequency (RF) receiver 123a, an RF transmitter 123b, a digital baseband processor 129, a processor 125, and a memory 127. A receive antenna 121a may be communicatively coupled to the RF receiver 123a. A transmit antenna 121b may be communicatively coupled to the RF transmitter 123b.

The RF receiver 123a may comprise suitable logic, circuitry, and/or code that may enable processing of received RF signals. The RF receiver 123a may enable receiving RF signals in a plurality of frequency bands. The RF receiver 123a may enable receiving signals in cellular frequency bands, for example, GSM, GPRS, EDGE and/or WCDMA. Each frequency band supported by the RF receiver 123a may have a corresponding front-end circuit for handling low noise amplification and down conversion operations, for example.

The RF receiver 123a may down convert the received RF signal to a baseband frequency signal that comprises an in-phase (I) component and a quadrature (Q) component. In some instances, the RF receiver 123a may enable analog-to-digital conversion of the baseband signal components before transferring the components to the digital baseband processor 129.

The digital baseband processor 129 may comprise suitable logic, circuitry, and/or code that may enable processing and/or handling of baseband frequency signals. In this regard, the digital baseband processor 129 may process or handle signals received from the RF receiver 123a and/or signals to be transferred to the RF transmitter 123b. The digital baseband processor 129 may also provide control and/or feedback information to the RF receiver 123a and to the RF transmitter 123b based on information from the processed signals. The digital baseband processor 129 may communicate information and/or data from the processed signals to the processor 125 and/or to the memory 127. Moreover, the digital baseband processor 129 may receive information from the processor 125 and/or to the memory 127, which may be processed and transferred to the RF transmitter 123b.

The RF transmitter 123b may comprise suitable logic, circuitry, and/or code that may enable processing of RF signals for transmission via a wireless medium. The RF transmitter 123b may enable transmission of RF signals in a plurality of frequency bands. Moreover, the RF transmitter 123b may enable transmission of signals in cellular frequency bands, for example. Each frequency band supported by the RF transmitter 123b may have a corresponding front-end circuit for handling amplification and/or up conversion operations, for example.

The RF transmitter 123b may up convert the baseband signal comprising magnitude and phase components to an RF signal. In some instances, the RF transmitter 123b may enable digital-to-analog conversion of the baseband signal components received from the digital baseband processor 129 before up conversion.

The processor 125 may comprise suitable logic, circuitry, and/or code that may enable control and/or data processing operations for the mobile terminal 120. The processor 125 may be utilized to control at least a portion of the RF receiver 123a, the RF transmitter 123b, the digital baseband processor 129, and/or the memory 127. In this regard, the processor 125 may generate at least one signal for controlling operations within the mobile terminal 120. The processor 125 may also enable execution of applications that may be utilized by the mobile terminal 120.

The memory 127 may comprise suitable logic, circuitry, and/or code that may enable storage of data and/or other information utilized by the mobile terminal 120. For example, the memory 127 may be utilized for storing processed data generated by the digital baseband processor 129 and/or the processor 125. The memory 127 may also be utilized to store information, such as configuration information, that may be utilized to control the operation of at least one block in the mobile terminal 120.

Figure 2:
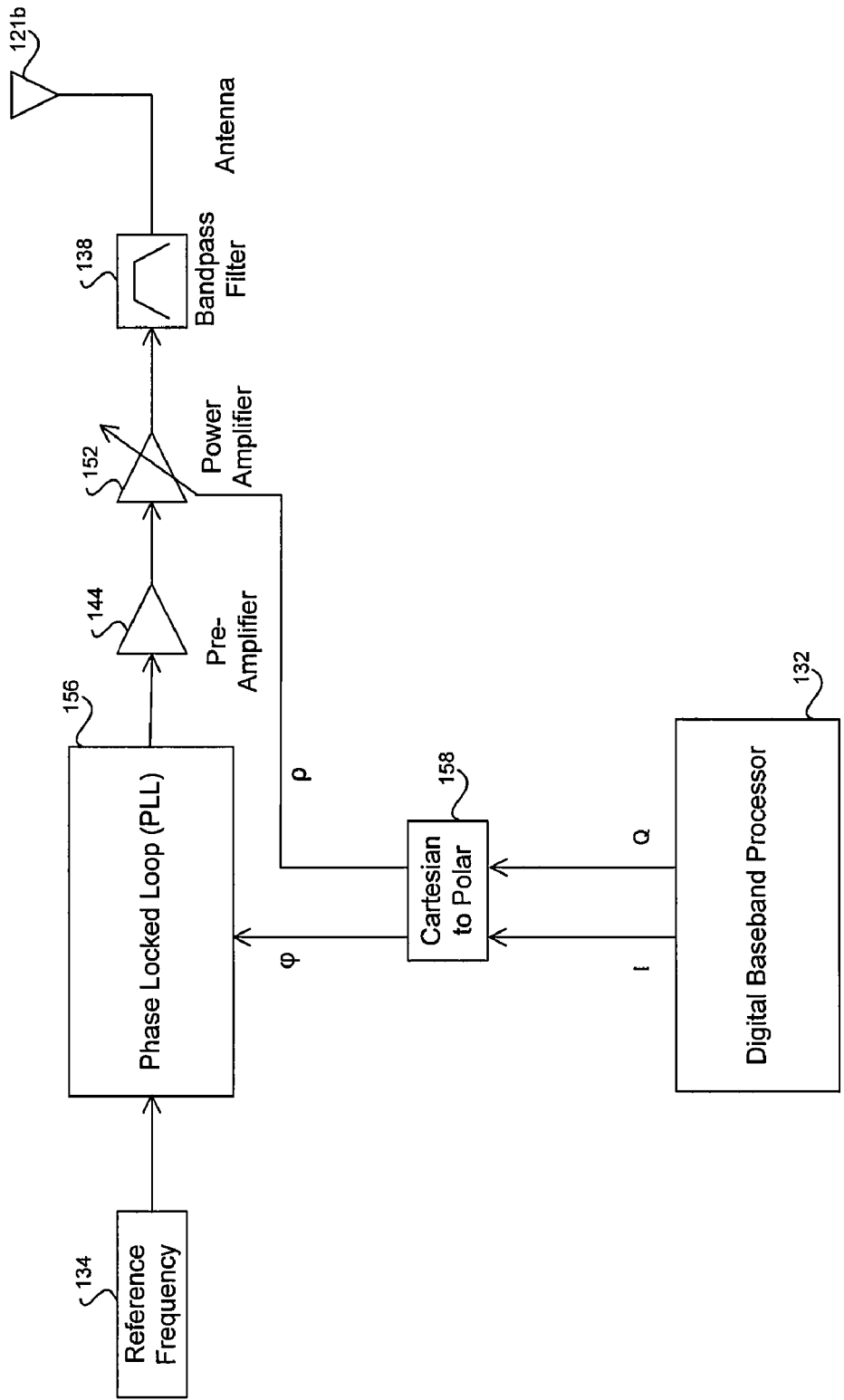
FIG. 2 is a block diagram illustrating an exemplary polar modulation transmitter, which may be utilized in connection with an embodiment of the invention.

FIG. 2 is a block diagram illustrating an exemplary polar modulation transmitter, which may be utilized in connection with an embodiment of the invention. Referring to FIG. 2, there is shown a digital baseband processor 132, a reference frequency block 134, a power amplifier 152, a bandpass filter 138, a transmit antenna 121b, a phase locked loop (PLL) 156, a preamplifier 144, and a Cartesian-to-polar conversion block 158. The polar modulation transmitter, as illustrated in FIG. 2, may be part of a mobile terminal, such as the mobile terminal 120 in FIG. 1, for example.

The reference frequency block 134 may comprise suitable logic, circuitry, and/or code that may enable generation of local oscillator (LO) and/or carrier frequency signals. The reference frequency block 134 may comprise a crystal, which may be utilized for generating the LO signals.

The digital baseband processor 132 may comprise suitable logic, circuitry, and/or code that may enable processing and/or handling of baseband frequency signals. The digital baseband processor may generate a digital baseband signal comprising in-phase (I) and quadrature phase (Q) components. The digital baseband signal may comprise a plurality of samples and each sample may comprise a plurality of bits, for example 12 bits. The samples within the digital baseband signal may occur at a sampling rate, for example 13 MHz. Each sample in the baseband digital signal, which may represent a plurality of signal levels, for example $2^{12}$, or 4,096, signal levels.

The bandpass filter 138 may comprise suitable logic, circuitry, and/or code that may enable generation of an output signal by processing an input signal to attenuate input signal amplitudes for a range of electromagnetic frequencies below a low frequency, $f_{LOW}$, and above a high frequency, $f_{HIGH}$. The range of frequencies that are greater than or equal to $f_{LOW}$ and less than or equal to $f_{HIGH}$ may comprise a pass band.

The preamplifier 144 may comprise suitable logic, circuitry, and/or code that may enable generation of an output signal whose signal level comprises a fixed or variable attenuation in comparison to a signal level associated with a corresponding input signal.

The power amplifier 152 may comprise suitable logic, circuitry, and/or code that may enable generation of an output signal, based on an input signal, with sufficient electrical power, that amplitude associated with the output signal may be maintained when the output signal is applied to an electrical load. The power amplifier 152 may be characterized by a linear operation when a change in amplitude for the input signal corresponds to a proportional change in amplitude for the output signal. The gain associated with the power amplifier 152 may be variable based on a received gain control input signal.

The Cartesian-to-polar conversion block 158 may comprise suitable logic, circuitry, and/or code that may enable generation of magnitude and phase components corresponding to a received input signal. The Cartesian-to-polar conversion block 158 may receive a digital baseband signal comprising I and Q components. The Cartesian-to-polar conversion block 158 may generate a representation of the digital baseband signal that comprises a magnitude ($\rho$) component and a phase ($\phi$) component. The magnitude component may represent amplitude modulated signal component and the phase component may represent a phase modulated signal component.

The PLL 156 may comprise suitable logic, circuitry, and/or code that may enable utilization of the phase modulated signal component to generate a synthesized RF signal. The PLL 156 may generate the synthesized RF signal based on an input phase signal. The PLL156 may generate a change in signal frequency for the synthesized RF signal based on a corresponding change in the input phase signal. The PLL 156 may perform calibration and pre-distortion procedures to equalize the corresponding change across a range of frequencies.

In operation, the digital baseband processor 132 may provide a baseband signal comprising I and Q signal components. The I and Q signal components may be communicated to the Cartesian-to-polar conversion block 158. The Cartesian-to-polar conversion block 158 may generate magnitude ($\rho$) and phase ($\phi$) signal components, which correspond to the received I and Q signal components. The phase signal component may be communicated to the PLL 156. The PLL 156 may utilize the phase signal component, and the LO signal and/or carrier frequency signal from the reference frequency block 134, to generate an RF synthesized signal. The frequency associated with the RF synthesized signal may be based on the carrier frequency derived from an input signal received from the reference frequency block 134.

The preamplifier 144 may modify the amplitude associated with the RF synthesized signal. The amplitude modified RF synthesized signal may comprise an output RF synthesized signal. The power amplifier 152 may modify the amplitude associated with the output RF synthesized signal based on the magnitude component signal, received from the Cartesian to polar conversion block 158. The output RF synthesized signal may comprise signal components that span a range of frequencies. The bandpass filter 138 may band limit the amplified output RF synthesized signal by reducing signal levels for signal components associated with frequencies that are not within the pass band for the bandpass filter 138. The transmit antenna 121b may enable the band limited signal to be transmitted via a wireless medium.

Figure 3:
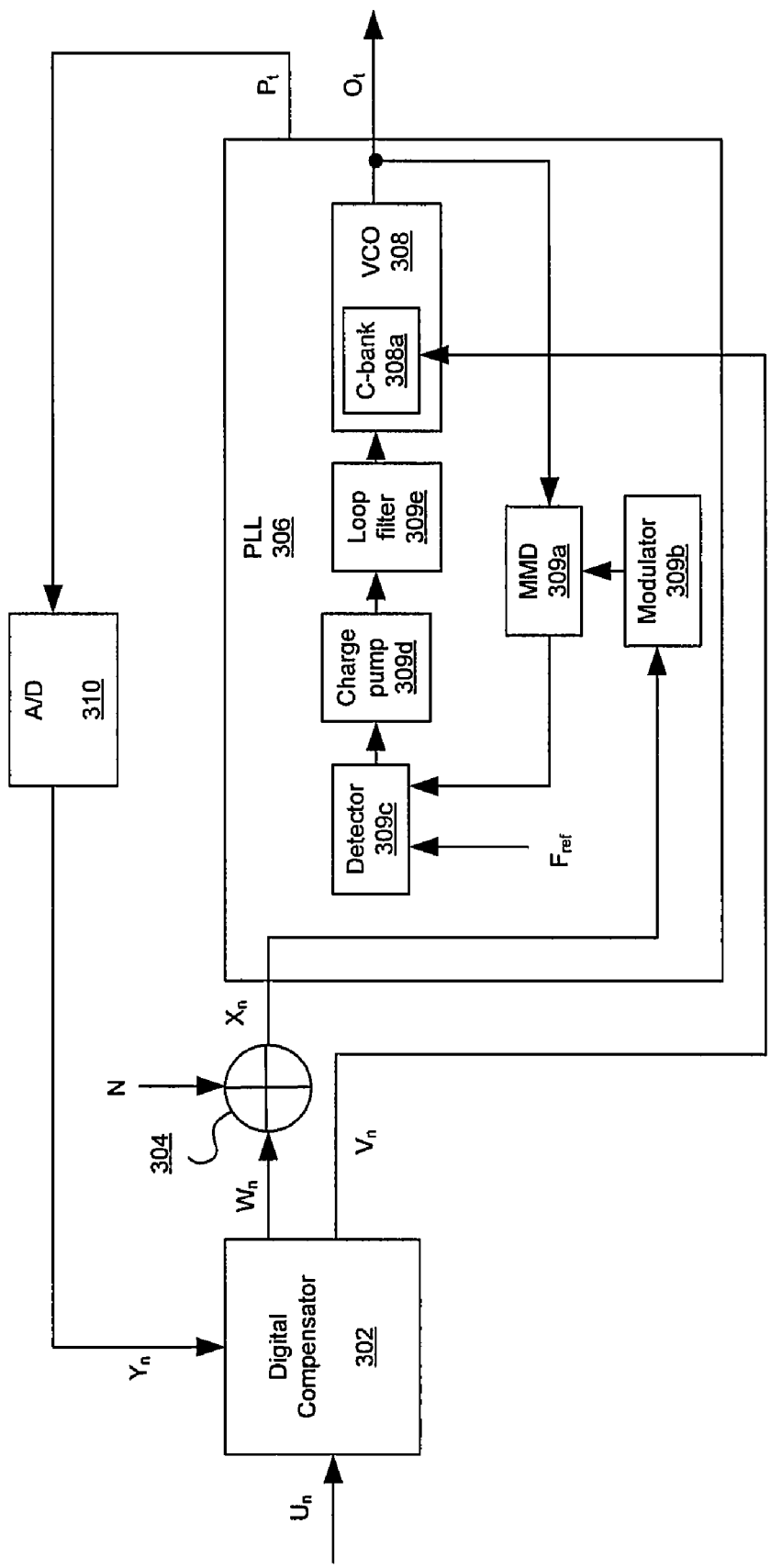
FIG. 3 is a block diagram of an exemplary two digital input PLL with feedback based compensation, in accordance with an embodiment of the invention.

FIG. 3 is a block diagram of an exemplary two digital input PLL with feedback based compensation, in accordance with an embodiment of the invention. Referring to FIG. 3, there is shown a digital compensator 302, a signal offset block 304, a fractional N PLL 306, and an analog-to-digital converter (ADC) 310. The digital compensator 302 may comprise suitable logic, circuitry, and/or code that may enable generation of compensated digital data signals appropriate for feeding a PLL, for example, the fractional N PLL 306. The signal scaling block 304 may comprise suitable logic, circuitry, and/or code that may enable generation of an output digital signal $X_n$ based on, for example, an input digital signal $W_n$ and an input N. The input N may represent an offset factor that may be communicated by, for example, the processor 125 and/or the digital baseband processor 129. For example, the input N may be related to a frequency for a transmission channel. The output digital signal from the signal offset block 304 may represent the value of the sum $W_n+N$, which may be computed utilizing binary addition, for example.

The fractional N PLL 306 may be substantially similar to the PLL 156. The fractional N PLL 306 may comprise a voltage controlled oscillator (VCO) 308, a multi-modulus divider (MMD) 309a, a sigma-delta modulator ($\Sigma\Delta$) 309b, a phase/frequency detector 309c, a charge pump 309d, and a loop filter 309e. The VCO 308 may comprise a capacitor bank 308a, where individual capacitors may be, for example, binary weighted, and individual capacitors may be switched on and off by a digital input or control signal. The operation of the fractional N PLL 306 is described in more detail with respect to the U.S. patent application Ser. No. 11/552,181 filed on Oct. 24, 2006, and which is incorporated herein in its entirety. There may be two digital input signals $X_n$ and $V_n$ communicated to the fractional N PLL 306 and two analog output signals $O_t$ and $P_t$ from the fractional N PLL 306. The analog output signal $P_t$ may be, for example, the output of the MMD 309a or the loop filter 309e, and may be used as a feedback signal to the digital compensator 302.

The Laplace transfer functions from the two digital input signals to the analog output signal $O_t$ for the fractional N PLL 306 may be expressed as:

$$H_{o1}(s) = \frac{F_{ref} \cdot K_d K_v \cdot F(s)/s}{1 + K_d K_v / N \cdot F(s)/s}, \quad (1)$$

-continued $$H_{o2}(s) = \frac{K_v \cdot N/s}{1 + K_d K_v/N \cdot F(s)/s}.$$

$H_{o1}(s)$ may be the Laplace transfer function from the digital input signal $X_n$ to the analog output signal $O_t$, and $H_{o2}(s)$ may be the Laplace transfer function from the digital input signal $X_n$ to the analog output signal $O_t$. $F_{ref}$ may be a reference clock to the phase/frequency detector 309c. $K_d$ may be a gain of the charge pump 309d, $K_v$ may be a gain of the VCO 308, and F(s) may be the Laplace transfer function of the loop filter 309e. N may be an appropriate value for scaling the reference clock $F_{ref}$ to the desired output frequency of the analog output signal $O_t$.

The Laplace transfer functions from the two digital input signals to the analog output signal $P_t$ of the fractional N PLL 306 when the analog output signal $P_t$ is an output of the loop filter 309e may be expressed as:

$$H_{p1}(s) = \frac{F_{ref}/(Ns)}{1 + K_d K_v/N \cdot F(s)/s}, \quad (2)$$

$$H_{p2}(s) = \frac{-K_v/(Ns^2)}{1 + K_d K_v/N \cdot F(s)/s}.$$

The Laplace transfer functions from the two digital input signals to the analog output signal $P_t$ of the fractional N PLL 306 when the analog output signal $P_t$ is an output of MMD 309a may be expressed as:

$$H_{p1}(s) = \frac{F_{ref} \cdot K_d/N \cdot F(s)}{1 + K_d K_v/N \cdot F(s)/s}, \quad (3)$$

$$H_{p2}(s) = \frac{-K_d K_v/N \cdot F(s)/s}{1 + K_d K_v/N \cdot F(s)/s}.$$

In operation, a digital signal, for example, $U_n$ may be received from, for example, the digital baseband processor 129. The digital signal $U_n$ may be communicated to the digital compensator 302. The digital compensator 302 may process the input signals appropriately based on the feedback signal $Y_n$ to generate compensated digital data signals for the fractional N PLL 306. The compensated digital data signals may be, for example, $W_n$ and $V_n$. The digital signal $W_n$ may be communicated to the signal offset block 304, where the digital signal $W_n$ may be scaled appropriately by the input N. The input N may refer to a channel that may be used for transmission. The output of the signal offset block 304, for example, the digital signal $X_n$, may be expressed as, for example:

$$X_n = W_n + N. \quad (4)$$

The compensated digital data signals $X_n$ and $V_n$ may be inputs to the fractional N PLL 306. The fractional N PLL 306 may appropriately process the compensated digital data signals to generate an analog output signal $O_t$ and an analog feedback signal $P_t$. The output signal $O_t$ may be, for example, similar to the output of the PLL 156 that may be amplified by the preamplifier 144. The analog feedback signal $P_t$ may be communicated to the ADC 310. The ADC 310 may generate the appropriate digital feedback signal $Y_n$ that may correspond to the analog feedback signal $P_t$. The digital compensator 302 is discussed in more detail with respect to the FIGS. 4, 6-8.

The compensated digital data signal $X_n$ may be communicated to the ΣΔ modulator 309b and the compensated digital data signal $V_n$ may be communicated to the VCO 308. The digital signals $X_n$ and $V_n$ may provide proper compensation for variations in PLL parameters such as, for example, bandwidth variations and capacitance mismatches in a PLL.

Figure 4:
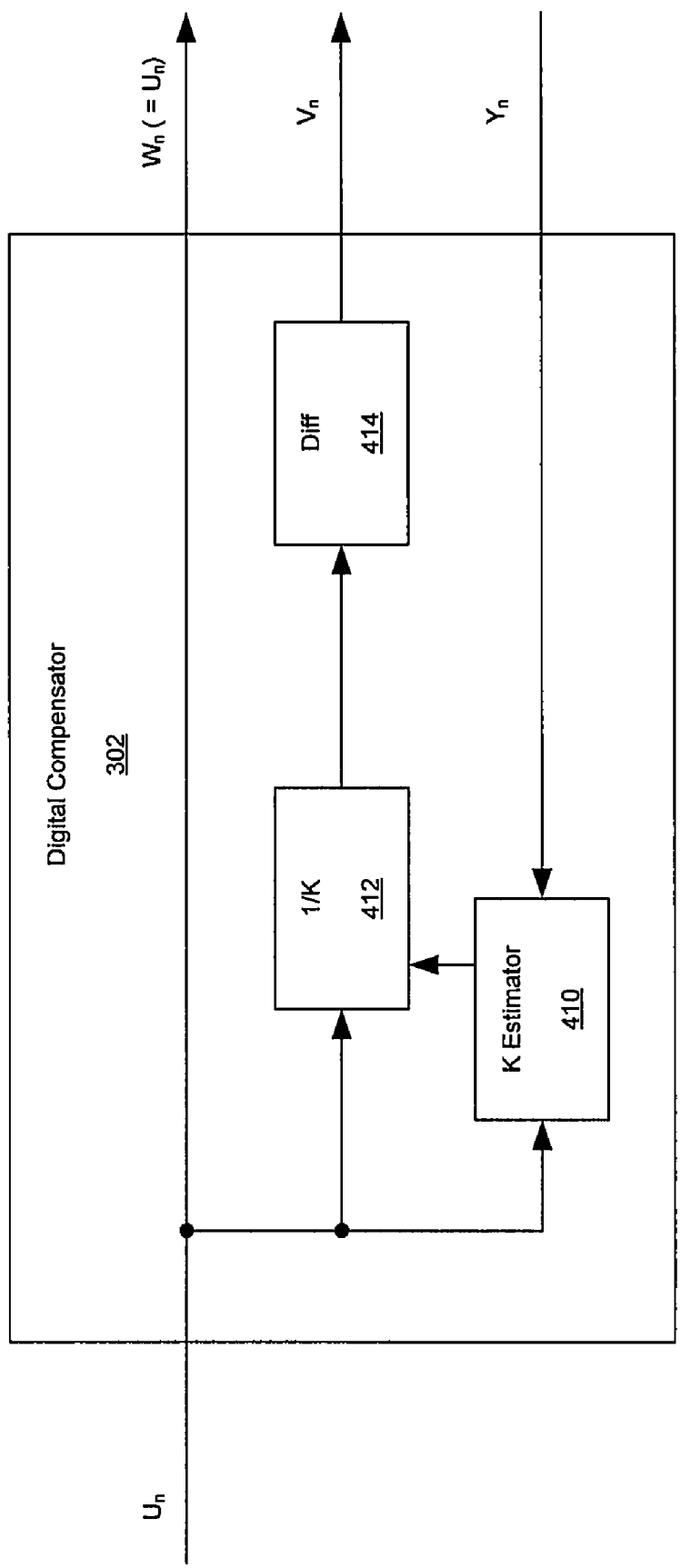
FIG. 4 is a block diagram of an exemplary bandwidth tracking digital compensator, in accordance with an embodiment of the invention.

FIG. 4 is a block diagram of an exemplary bandwidth tracking digital compensator, in accordance with an embodiment of the invention. Referring to FIG. 4, there is shown the digital compensator 302, which may comprise a K estimator block 410, a 1/K gain block 412, and a differentiator block 414. The K estimator block 410 may comprise suitable logic, circuitry, and/or code that may enable processing a feedback signal $Y_n$ and a digital input signal $U_n$ to generate an estimate for a tuning parameter K. The parameter K may be representative of, for example, a bandwidth parameter for the fractional N PLL 306. Accordingly, the tuning parameter K may be used for bandwidth tracking the fractional N PLL 306.

For example, the compensated digital data signal $V_n$ may be a derivative of $U_n/K$. Then the Laplace transfer function from $U_n$ to the PLL output signal $O_t$ may be, for example:

$$H_o(s) = H_{o1}(s) + (s/K) \cdot H_{o2}(s). \quad (5)$$

Accordingly, setting K equal to $K_v/F_{ref}$ may imply that $H_o(s) = N^* F_{ref}$, where $H_o(s)$ may have an all-pass characteristic. Since a PLL bandwidth may depend on the product $K_v^* K_d$ and $K_d$ is a known parameter, tracking $K_v$ may be equivalent to bandwidth tracking. Consequently, the digital signals $X_n$ and $V_n$ may compensate the low-pass frequency characteristic of the PLL regardless of the PLL bandwidth variations. Estimation of K may be made with a tolerance that may be design dependent. This may be due to a trade-off, for example, of the processing time and/or processing hardware and/or software.

Similarly, with the digital control signal $V_n$ as a derivative of $U_n/K$, the Laplace transfer function from $U_n$ to the PLL output signal $O_t$ may be, for example:

$$H_p(s) = H_{p1}(s) + (s/K) \cdot H_{p2}(s). \quad (6)$$

Accordingly, setting K equal to $K_v/F_{ref}$ may imply that $H_p(s) = 0$. Therefore, K may be estimated by minimizing the magnitude of the digital feedback signal $Y_n$. The Laplace transform of the digital feedback signal $Y_n$ may be approximated by, for example:

$$Y(s) \cong \left( \frac{B_1(s)}{A_1(s)} + \frac{1}{K} \frac{B_2(s)}{A_2(s)} \right) U(s) \quad (7)$$

where $$\frac{B_1(s)}{A_1(s)} = H_{p1}(s), \quad (8)$$

$$\frac{B_2(s)}{A_2(s)} = F_{ref} \cdot s H_{p2}(s).$$

Accordingly, $$Y_{n+1}(k) \cong -\left( A_{1,K_0}^T + A_{2,K_0}^T \right) Y_n + \left( B_{1,K_0}^T + \frac{1}{K} B_{2,K_0}^T \right) U_n, \quad (9)$$

where $A_r$, $K_0$ and $B_{r,k0}$ may be coefficient vectors of digitized $B_r(s)/A_r(s)$ with $K_v$ comprising an arbitrary reference value $K_0$. Accordingly, K may be tracked by minimizing the error function:

$$J_{n+1}(K) = y_{n+1}^2(K). \quad (10)$$

Since $$\frac{d}{dK}J_{n+1} = 2Y_{n+1}\left(B_{2,K_0}^T U_n\right)\frac{1}{K^2}, \quad (11)$$

the error function may be minimized by:

$$K_{n+1} = K_n - \mu \cdot \left(B_{2,K_0}^T U_n\right)\frac{Y_{n+1}}{K_n^2}. \quad (12)$$

Accordingly, equation (12) may be implemented by a least mean square (LMS) K-estimator, such as, for example, the K estimator block 410.

The 1/K gain block 412 may comprise suitable logic, circuitry, and/or code that may enable a gain of 1/K to the input signal $U_n$, where the gain of 1/K may change as the K estimate changes. The differentiator block 414 may comprise suitable logic, circuitry, and/or code that may enable approximation of a derivative of the input signal. In accordance with an embodiment of the invention, a previous input may be subtracted from the present input. Accordingly, a relative change in the output of the 1/K gain block 412 may be communicated to the PLL.

In operation, the input to the digital compensator 302, for example, $U_n$, may be communicated to the K estimator block 410 and the 1/K gain block 412. The K estimator block 410 may generate an estimation of K based on the feedback signal $Y_n$. The estimate of K may be communicated to the 1/K gain block 412, which may appropriately process the input $U_n$ using the estimated value of K. The output of the 1/K gain block 412 may be communicated to the differentiator block 414. The differentiator block 414 generate a difference value for the digital control signal $V_n$ between a present output from the 1/K gain block 412 and a previous output from the 1/K gain block 412. The difference value for the digital control signal $V_n$ may be communicated to, for example, the PLL 306 as a compensated data signal. The input $U_n$ may also be communicated from the digital compensator 302 to the PLL 306 as a compensated signal via, for example, the signal offset block 304.

Figure 5:
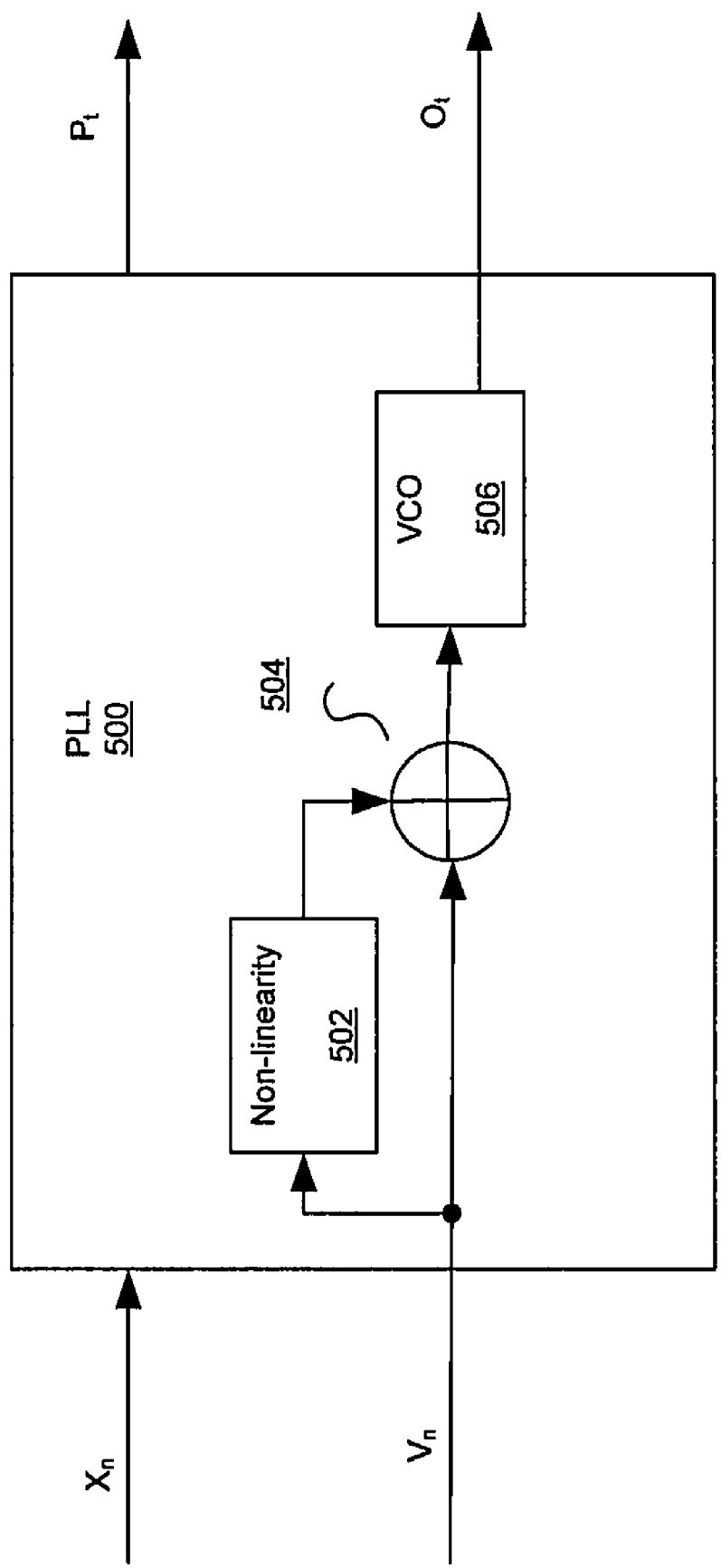
FIG. 5 is an exemplary block diagram illustrating PLL with input non-linearities, which may be utilized in connection with an embodiment of the invention.

FIG. 5 is an exemplary block diagram illustrating a PLL with input non-linearities, which may be utilized in connection with an embodiment of the invention. Referring to FIG. 5, there is shown a PLL 500 that may comprise non-linear portions 502, an adder 504, and a VCO 506. The PLL 500 may be similar, for example, to the PLL 306. The non-linear portion 502 may comprise, for example, inaccuracies such as capacitance mismatches in the PLL 500. This may be due to, for example, parasitic capacitances due to non-ideal parts and/or implementation of devices, such as, for example, the capacitor bank 308a. Accordingly, each capacitor that may be activated in the capacitor bank 308a may contribute a parasitic capacitance that may add to the non-linear portion 502. This may result in the digital control signal $V_n$ not affecting the PLL 500 as desired.

For example, a finite representation of the digital control signal V may be represented by the following expression:

$$V = \sum_{i=1}^{I} b^{(i)} 2^i \quad (13)$$

where I may be the word-length of V. Ideally, this may result in a capacitance C in the VCO 506, which may be represented by the following expression:

$$C = \sum_i b^{(i)} C^{(i)}, \quad (14)$$

where $$C^{(i)} = 2^i C^{(0)} \quad (15)$$

for some base capacitance $C^{(0)}$.

However, generally, $C^{(i)}$ may be coupled to some small additive unknown capacitance $X^{(i)}$ that may not be linear with $C^{(i)}$. Accordingly, $X^{(i)}$ may be used to model capacitance implementation deficiency, process variation, as well as time variability because of temperature and aging effects. Consequently, the digital control signal V may result in an equivalent capacitance of:

$$C_{equiv} = \sum_i b^{(i)}(C^{(i)} + X^{(i)}) = \sum_i b^{(i)}\left(C^{(i)} + \sum_j d^{(ij)}C^{(j)}\right), \quad (16)$$

where $d^{(ij)}$ may denote the $j^{th}$ mismatch component of the $i^{th}$ capacitance. The binary representation of the equivalent input sample may be represented by the following exemplary expressions:

$$V_{equiv} = \sum_i b^{(i)}\left(2^i + \sum_j d^{(ij)}2^j\right) = \sum_i b^{(i)}(2^i + d^{(i)}) = v + \sum_i b^{(i)}d^{(i)}, \quad (17)$$

where $d^{(i)}$ may be interpreted as the mismatch input associated to the capacitance $X^{(i)}$.

The capacitance mismatches may be measured, for example, by proper triggering of the PLL and by measuring the effect on the generated frequency. However, adequate measurement accuracy may usually require long measurement time, which may usually be impractical.

Figure 6:
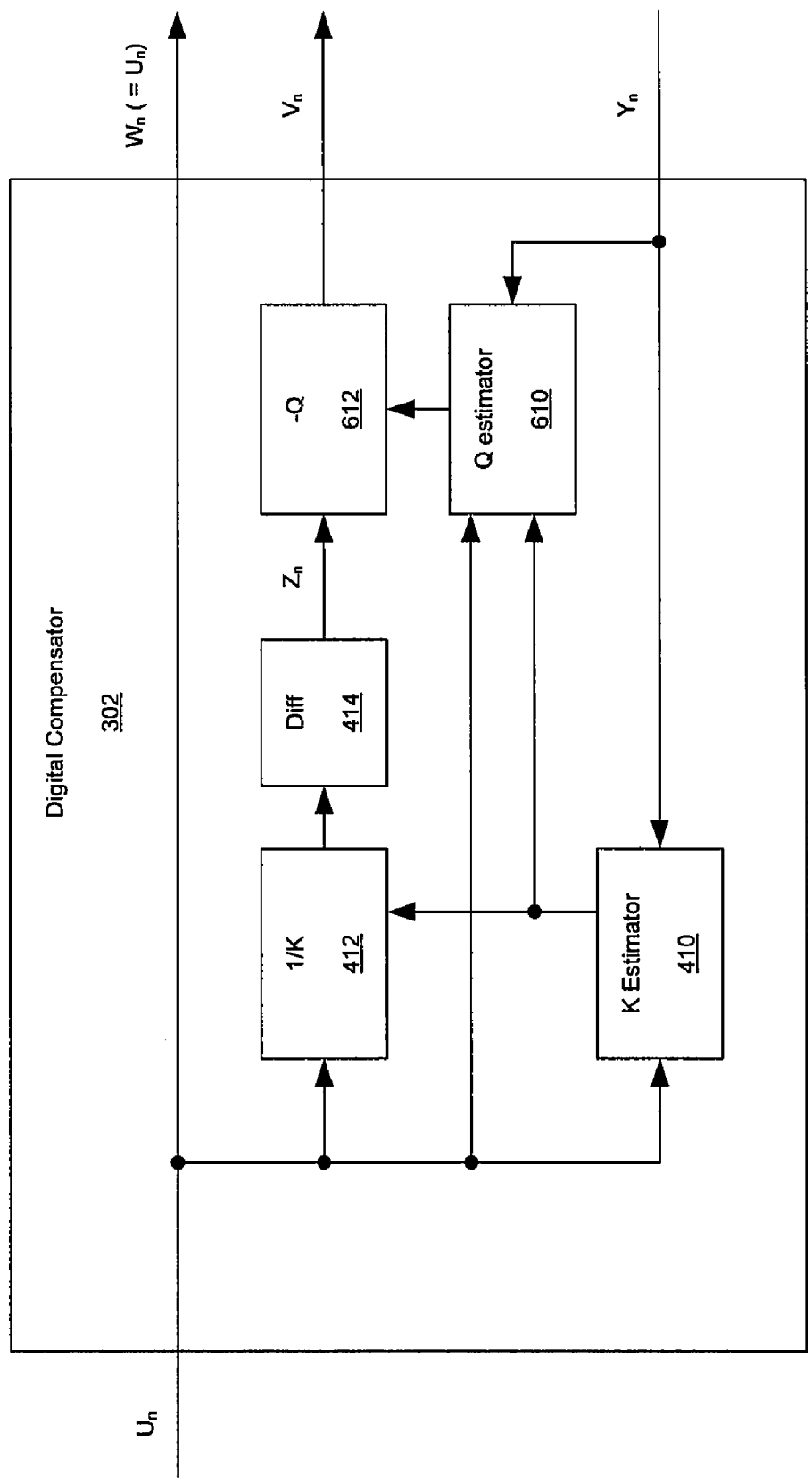
FIG. 6 is a block diagram of an exemplary bandwidth tracking and capacitance mismatch digital compensator, in accordance with an embodiment of the invention.

FIG. 6 is a block diagram of an exemplary bandwidth tracking and capacitance mismatch digital compensator, in accordance with an embodiment of the invention. Referring to FIG. 6, there is shown the digital compensator 302 comprising the K estimator block 410, the 1/K gain block 412, the differentiator block 414, the Q estimator block 610 and the noise eliminator block 612. The K estimator block 410, the 1/K gain block 412, and the differentiator block 414 may be similar to the corresponding blocks described with respect to FIG. 4.

The Q estimator block 610 may comprise suitable logic, circuitry, and/or code that may enable generation of an estimate for Q to offset, for example, the non-linear portions 502 in the PLL 500. The Q estimator block 610 may be implemented using, for example, a LMS algorithm to estimate capacitance mismatch parameters $d^{(i)}$, i=1, . . . , I using the estimators $q^{(i)}$, i=1, . . . , I.

The differentiator block 414 may generate, for example, bandwidth compensated and differentiated samples $Z_n$. The noise eliminator block 612 may subtract, for example, the estimated capacitance mismatches controlled by the binary representation of its input:

$$V_n = Z_n - \sum_i Q_n^{(i)} \cdot \delta(Z_n^{(i)}, 1), \tag{18}$$

$$\text{where } \delta(\alpha, \beta) = \begin{cases} 1, & \alpha = \beta \\ 0, & \text{otherwise} \end{cases}$$

Accordingly, $V_n$ may be reduced by the estimated noise due to capacitance mismatch, thus offsetting the noise.

The Laplace transform of the LMS input may be, for example:

$$Y(s) = \frac{B_1(s)}{A_1(s)} U(s) + \frac{1}{K} \frac{B_2(s)}{A_2(s)} (U(s) + D(s) - Q(s)), \tag{19}$$

where D(s) and Q(s) may represent the transforms of the mismatch input and its compensation. Accordingly, $$Y_{n+1}(Q^{(1)}, \ldots, Q^{(I)}) \cong \tag{20}$$
$$-(A_{1,K_0}^T + A_{2,K_0}^T) Y_n + \cdot B_{1,K_0}^T U_n + \frac{1}{K_n} B_{2,K_0}^T \cdot (U_n + D_n - Q_n),$$

where $A_{r,k0}$ and $B_{r,k0}$ may be coefficient vectors of digitized $B_r(s)/A_r(s)$ with $K_v$ taking an arbitrary reference value $K_0$. Also, $Q_n = [Q_n Q_{n-1} \ldots Q_{n-L+1}]$ and $$Q_m = \sum_{i=1}^{I} Q_m^{(i)} \delta((U_m/K_m)^{(i)}, 1), m = n - L + 1, \ldots, n, \tag{21}$$

where L may the length of $B_{k0}$

Minimizing the error function derives the parameter estimators:

$$J_{n+1}(Q^{(1)}, \ldots, Q^{(I)}) = Y_{n+1}^2(Q^{(1)}, \ldots, Q^{(I)}). \tag{22}$$

This may result in an algorithm described by:

$$Q_{n+1}^{(i)} = Q_n^{(i)} + \mu \cdot \frac{Y_{n+1}}{K_n} \beta_i \delta((U_n/K_n)^{(i)}, 1), i = 1, \ldots, I \tag{23}$$

where $\beta_i$ may be a $i^{th}$ element of $B_{2,k0}{}^T$. This algorithm may be implemented, for example, by the Q estimator block 610.

Figure 7:
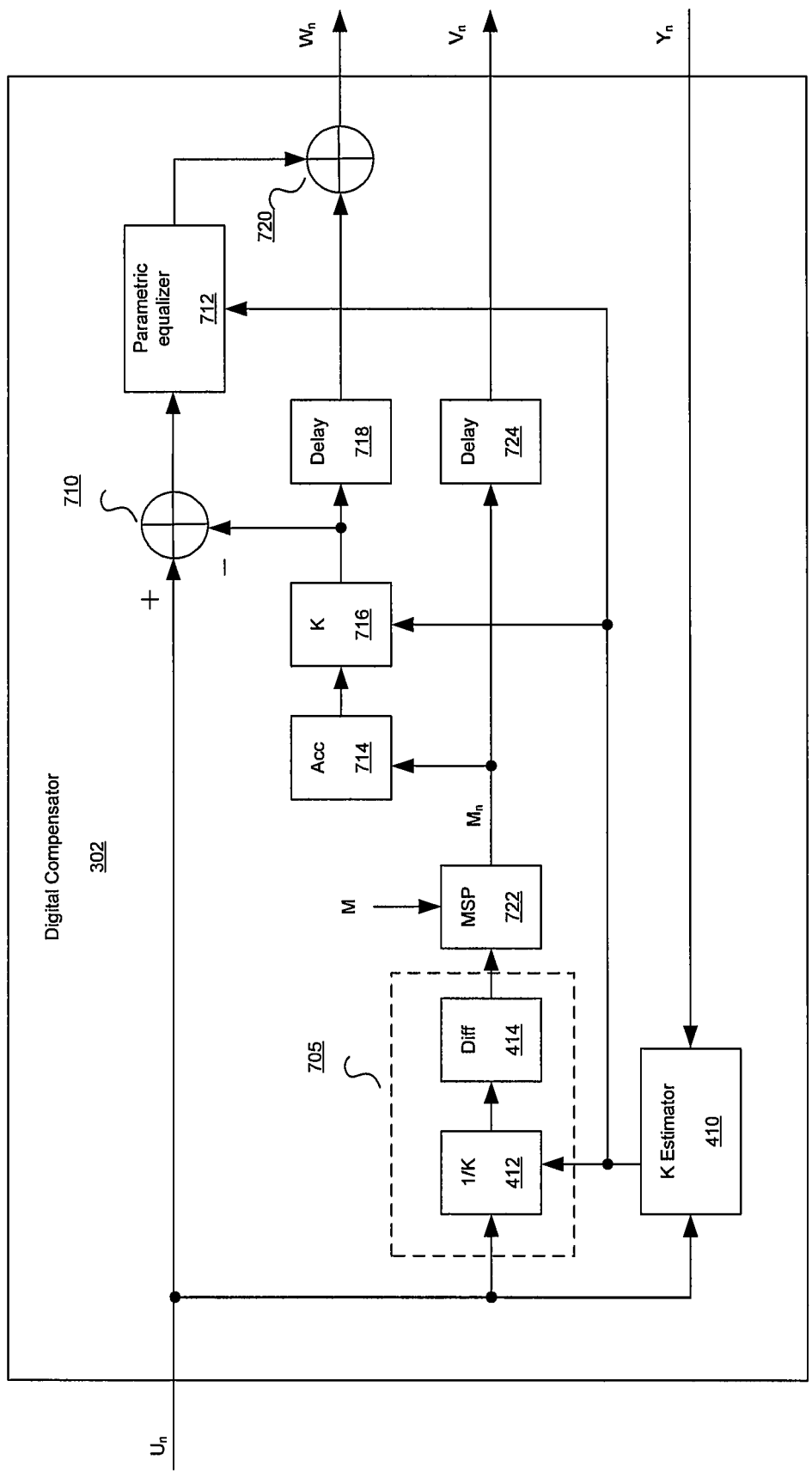
FIG. 7 is a block diagram of an exemplary bandwidth tracking digital compensator with a parametric equalizer, in accordance with an embodiment of the invention.

FIG. 7 is a block diagram of an exemplary bandwidth tracking digital compensator with a parametric equalizer, in accordance with an embodiment of the invention. Referring to FIG. 7, there is shown the digital compensator 302 that may comprise the K estimator block 410, the 1/K gain block 412, the differentiator block 414, a combiner block 710 and a combiner block 720, a parametric equalizer block 712, an accumulator 714, a K gain block 716, a delay block blocks 718 and a delay block 724, and a most significant part (MSP) block 722.

The K estimator block 410, the 1/K gain block 412, and the differentiator block 414 may be as described with respect to FIG. 4. The 1/K gain block 412 and the differentiator block 414 may also be referred to as a compensator block 705. The combiner blocks 710 and 720 may comprise suitable logic, circuitry, and/or code that may enable combining of two digital signals. For example, the combiner block 710 may subtract the output of the K gain block 716 from the digital input signal $U_n$. The combiner block 720 may, for example, add the output of the parametric equalizer 712 with the output of the delay block 718.

The parametric equalizer block 712 may comprise suitable logic, circuitry, and/or code that may enable generation of a digital output signal by digitally filtering a digital input signal. The filtering characteristics of the parametric equalizer block 712 may be configured to control, for example, the bandwidth, center frequency, and/or pass band gain. The filtering characteristics may be configured to compensate for distortions in the PLL output signal $O_t$ due to unequal frequency response in the Fractional N PLL 306. For example, the parametric equalizer 712 may emphasize the high frequency content of the input signal to compensate for the low pass characteristic of the Fractional N PLL 306.

Accordingly, the parametric equalizer 712 may offset the effects of the fractional N PLL 306 with respect to frequency response with minimal distortion of the signals. Since the behavior of the fractional N PLL 306 depends on the bandwidth parameter K, the parametric equalizer 712 may operate based on the estimated value of K. Accordingly, in various embodiments of the invention, the filtering characteristics may be configured based on a digital control input signal, such as, for example, from the K estimator block 410.

The accumulator 714 may comprise suitable logic, circuitry, and/or code that may enable approximating integration of digital data from, for example, the MSP block 722. The integrated data may be communicated to the K gain block 716 for appropriate processing as needed. An exemplary embodiment of the invention may use accumulation of data to approximate integration. The size of the accumulator may be design dependent. The K gain block 716 may process an input signal to give the input signal a gain of K, where K may be communicated by the K estimator block 410. Accordingly, the K gain block 716 may be thought of as performing an inverse operation with respect to the 1/K gain block 412. The delay blocks 718 and 724 may comprise suitable logic, circuitry, and/or code that may enable delaying of digital signals by an appropriate amount of time. The appropriate delay may be a design decision. The delay blocks 718 and 724 may be used, for example, to compensate for latency of the parametric equalizer 712 and the fractional N PLL 306.

In accordance with an embodiment of the invention, the length of the word size of the compensated digital data signal $V_n$ may be large. However, as the word-length of $V_n$ increases, the size of the capacitor bank 308a may also need to increase. This may be because the digital control signal $V_n$ may indicate the specific capacitors that may need to be switched on. An exemplary embodiment of the invention may also reduce the size of $V_n$ while also reducing effects of the non-linear portions 502.

The MSP block 722 may comprise suitable logic, circuitry, and/or code that may enable extraction of the M most significant bits of the input signal to the MSP block 722. To vary the word length of $V_n$, a word-length M may be indicated to the MSP block 722, for example, by the processor 125 and/or the digital baseband processor 129. An embodiment of the invention may fix M to a constant value. The MSP block 722 may accordingly output the M most significant bits of inputs received by the MSP block 722. As M gets smaller, the quantization error for $V_n$ may increase. However, this may be offset by using the parametric equalizer 712 to process signals that may be used to generate the compensating digital data signal $W_n$. Accordingly, this may result in a small dynamic range for $W_n$ while also reducing the word length for $V_n$.

The delay blocks 718 and 724 may compensate for the combined latency of the parametric equalizer 712 and the PLL 306. The Laplace transform of the output W(s) as a function of U(s) and the MSP output M(s) may be represented by the following expression:

$$W(s) = H_{o1}(s)(G(s,K)U(s) + M(s)(K - KG(s,K))) + sM(s)H_{o2}(s) \quad (24)$$

where G(s,K) may be the transfer function of the parametric equalizer 712. If K becomes equal to $K_v/F_{ref}$, then:

$$H_{o1}(s) + \frac{s}{k}H_{o2}(s) = N \cdot F_{ref} \quad (25)$$

and $$H_{o1}(s)G(s,k) = N \cdot F_{ref} \quad (26)$$

Consequently, W(s) may become equal to U(s), which may imply that the PLL output $O_t$, which may be used for transmitter input, may be properly modulated. This may be true if the K estimator block 410 has converged. In an embodiment of the invention, the compensator block 705 may not affect the transfer function after convergence. Accordingly, the compensator block 705 may be designed to minimize the dynamic range of the parametric equalizer 712 output.

In operation, the input signal $U_n$ may be communicated to the digital compensator 302. The input signal $U_n$ may be processed by the 1/K gain block 412, the differentiator 414, and the MSP block 722. The resulting M significant bits output by the MSP block 722 may be communicated to the delay block 724 and the accumulator 714. The accumulator 714 may store the M bits, and may communicate the stored bits to the K gain block 716. The K gain block 716 may process the M bits from the accumulator 714, where the K gain block 716 may do an inverse operation with respect to the 1/K gain block 412. The output of the K gain block 716 may be communicated to the delay block 718 and the combiner block 710.

The combiner block 710 may, for example, subtract the output of the K gain block 716 from the input signal $U_n$. The output of the combiner block 710 may be communicated to the parametric equalizer 712. The output of the K gain block 716 may be delayed by the delay block 718 such that the delay provided by the delay block 716 may be approximately equal to the latency associated with the parametric equalizer 712 and the PLL 306. The outputs of the parametric equalizer 712 and the delay block 718 may be added by the combiner block 720. The output of the combiner block 720 may be the compensated digital data signal $W_n$. The output of the MSP 722 may be delayed appropriately by the delay block 724 in order to synchronize the compensated digital data signal $V_n$ appropriately with the compensated digital data signal $W_n$.

Figure 8:
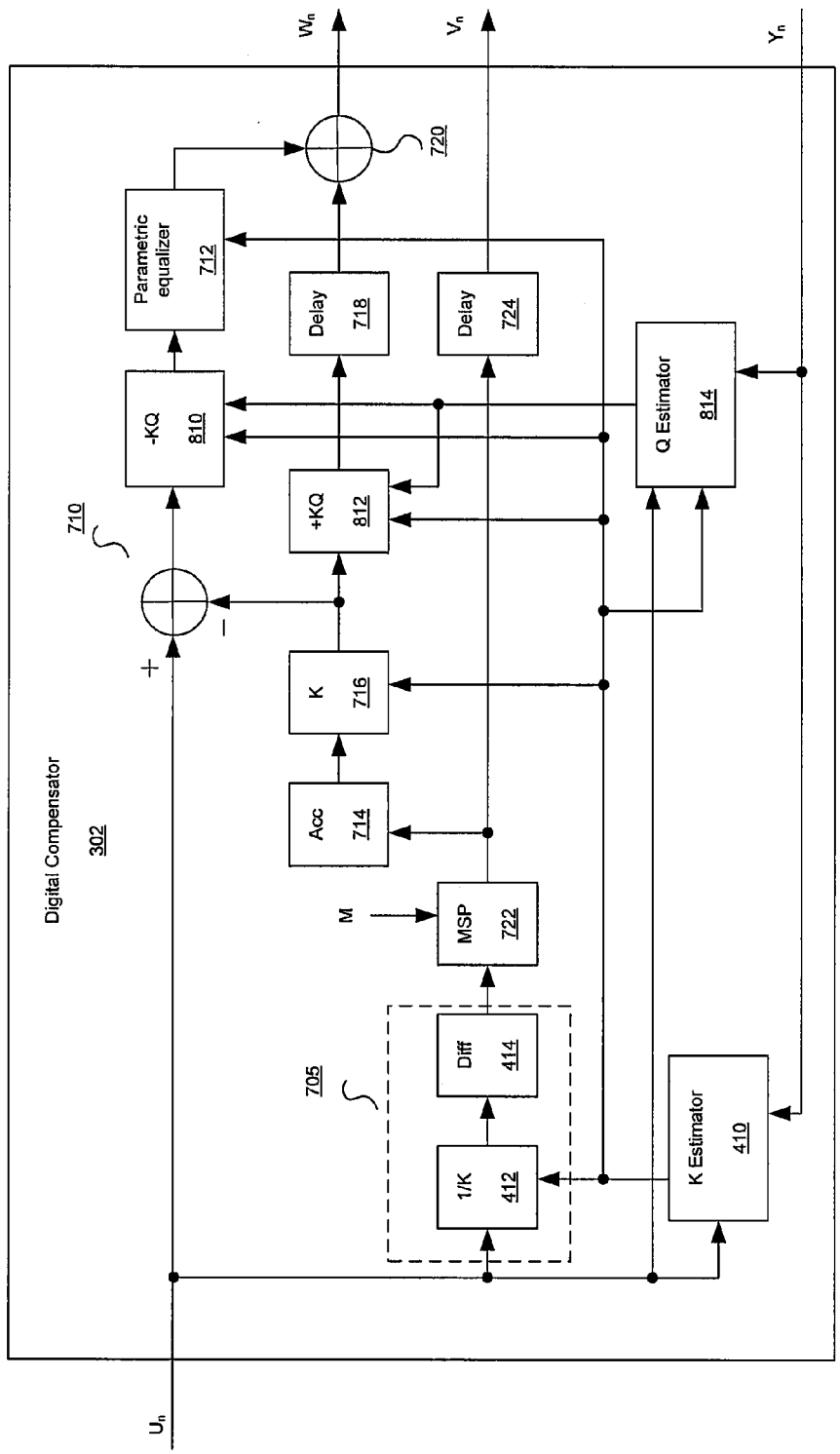
FIG. 8 is a block diagram of an exemplary bandwidth tracking and capacitance mismatch digital compensator with a parametric equalizer, in accordance with an embodiment of the invention.

FIG. 8 is a block diagram of an exemplary bandwidth tracking and capacitance mismatch digital compensator with a parametric equalizer, in accordance with an embodiment of the invention. Referring to FIG. 8, there is shown the K estimator block 410, the 1/K gain block 412, and the differentiator block 414 as discussed with respect to FIG. 4. There is also shown the combiner blocks 710 and 720, the parametric equalizer 712, the accumulator block 714, the K gain block 716, the delay blocks 718 and 724, and the MSP block 722 as described with respect to FIG. 7.

There is also shown a noise elimination block 810, a noise elimination block 812, and the Q estimator block 814. The noise elimination blocks 810 and 812 may comprise suitable logic, circuitry, and/or code that may enable processing an input signal to reduce noise estimated to be due to capacitance mismatch in the fractional N PLL 306. The noise elimination blocks 810 and 812 may be similar to the noise elimination block 612. However, while the noise elimination block 612 may remove noise from the output $V_n$, the noise elimination blocks 810 and 812 may operate to remove noise from the output $W_n$. This may be because the output $V_n$ with respect to FIG. 8 may have a reduced word length due to the operation of the MSP block 722. The noise reduction may therefore be based on the K estimates from the K estimator block 410 and the Q estimates from the Q estimator block 814. The Q estimator block 814 may be similar to the Q estimator block 610.

For example, the noise elimination block 810 may be characterized by the following expression:

$$R_n - K_n \sum_i Q_n^{(i)} \cdot \delta(V_n^{(i)}, 1) \quad (27)$$

where $R_n$ may be the output of the combiner block 710. The noise elimination block 812 may be characterized by the following expression:

$$M_n + K_n \sum_i Q_n^{(i)} \cdot \delta(V_n^{(i)}, 1). \quad (28)$$

where $M_n$ may be the output of the K gain block 716.

The Q estimator block 814 may be characterized by the following expression:

$$Q_{n+1}^{(i)} = Q_n^{(i)} + \mu \cdot \frac{Y_{n+1}}{K_n}\beta i\delta(V_n^{(i)}, 1), i = 1, \ldots, M \quad (29)$$

The compensation for the mismatch associated to $V_n$ may be applied to the parametric equalizer 712 and the $W_n$ output rather than the $V_n$ output. This may be shown to be a correct application by the Laplace transform of the PLL output O(s) generated as an effect of the compensation signal Q(s), which may be represented by the following expression:

$$-kQ(s)G(s,k)H_{o1}(s) + kQ(s)H_{o1}(s) = -Q(s)H_{o2}(s) \quad (30)$$

provided that the K estimator 410 has converged. Accordingly, the number of capacitor elements in the capacitor bank 408a may be small while the size of the capacitor elements may be large. This may imply a simpler and more robust VLSI implementation.

Figure 9:
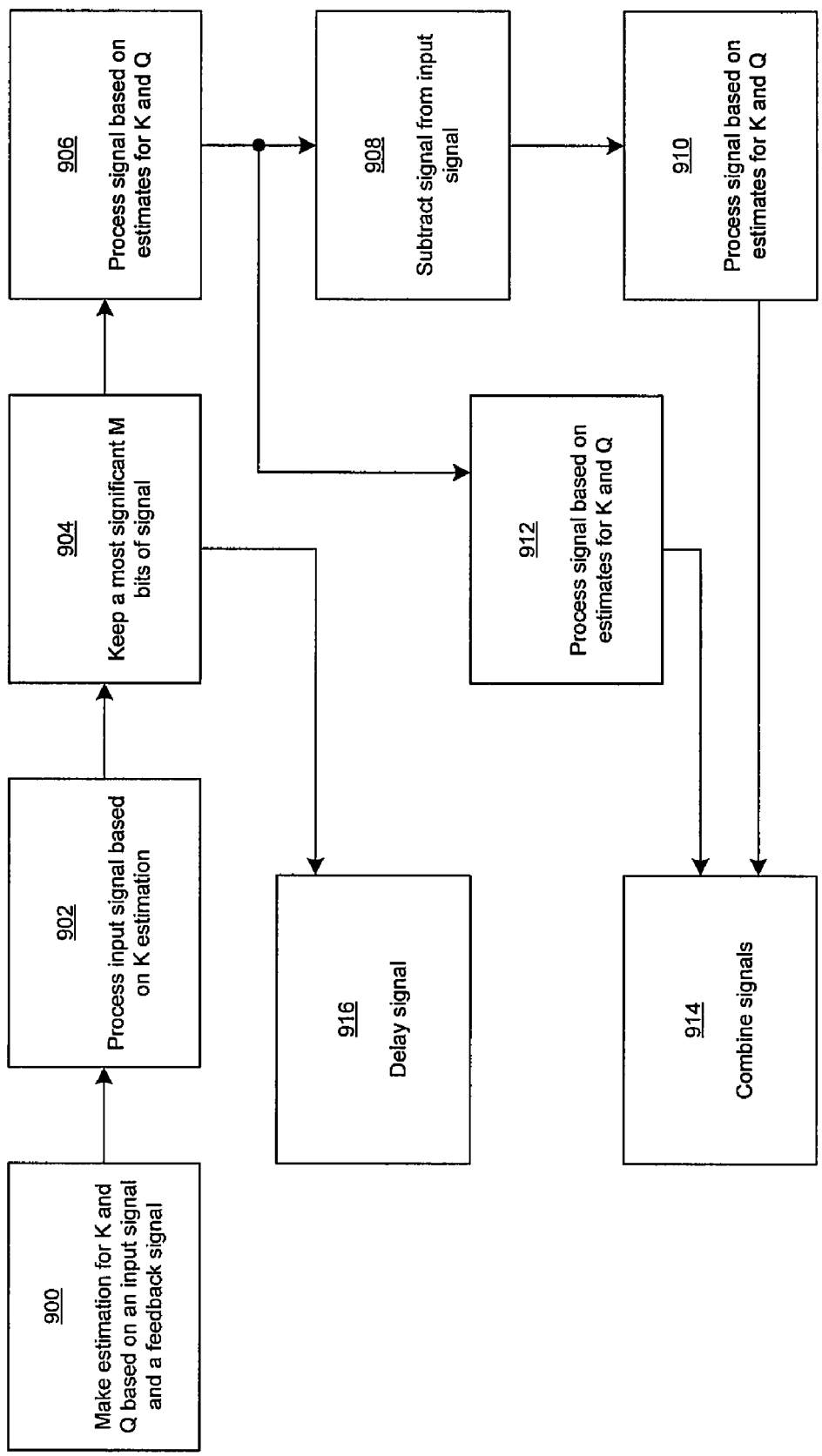
FIG. 9 is a flowchart illustrating exemplary steps for direct and polar modulation using a two input PLL, in accordance with an embodiment of the invention.

FIG. 9 is a flowchart illustrating exemplary steps for direct and polar modulation using a two input PLL, in accordance with an embodiment of the invention. Referring to FIG. 9, there is shown steps 900 to 914. In step 900, The K estimator 410 may generate estimates for the bandwidth parameter K of the fractional N PLL 306 based on the digital feedback signal $Y_n$. The digital feedback signal $Y_n$ may be a digital signal from the ADC 310 corresponding to analog feedback signal $P_r$ from the fractional N PLL 306. The Q estimator 814 may generate Q estimates based on the digital feedback signal $Y_n$, the K estimate from the K estimator 410, and the input signal $U_n$. The Q estimates may comprise parameters used to estimate noise due to capacitance mismatch in, for example, the fractional N PLL 306. In step 902, the input signal $U_n$ may be processed by the 1/K gain block 412 and the differentiator block 414. The processed signal may be used to control a capacitance of, for example, the capacitor bank 308a. In step 904, the M most significant bits of the output of the differentiator block 414 may be extracted by the MSP block 722. Accordingly, length of the digital control signal may be reduced. The next step may be step 916.

In step 906, the M most significant bits may be processed by the accumulator 714 and the K gain block 716. This may be an inverse operation of the 1/K gain block 412 and the differentiator block 414. The next steps may be steps 908 and 912. In step 908, the processed M most significant bits may be subtracted from the input signal $U_n$, thus reducing the dynamic range of the resulting signal at the output of the combiner block 710. In step 910, an output signal from the combiner block 710 may be processed by the noise elimination block 810 based on K and Q estimates. Accordingly, the output of the noise elimination block 810 may be compensated for anticipated noise from, for example, the fractional N PLL 306. The resulting signal may then be processed by the parametric equalizer 712 based on the K estimate. The parametric equalizer 712 may emphasize high frequency content of the signal from the noise elimination block 810 to compensate for the low-pass characteristic of the fractional N PLL 306. The next step may be step 914.

In step 912, which may be the next step after step 906, an output of the K gain block 716 may be processed by the noise elimination block 812 based on the K and Q estimates. Accordingly, the output of the noise elimination block 812 may be compensated for anticipated noise from, for example, the fractional N PLL 306. The output of the noise elimination block 812 may be delayed by the delay block 718 to synchronize the output of the delay block 718 with the output of the parametric equalizer 712. In step 914, the output of the parametric equalizer 712 and the output of the delay block 718 may be combined together to form the digital control signal $W_n$. In step 916, the output of the MSP block 722 may be delayed by the delay block 724 to synchronize it with output of the combiner block 720. The output of the delay block 724 may be the digital control signal $V_n$.

While some specific embodiments of the invention may have been described for exemplary purposes, the invention need not be so limited. For example, the LMS algorithm may be replaced with other adaptive algorithms such as, for example, gradient descent algorithm. Embodiments of the invention may be used with by any wireless communication system, such as, for example, GSM, EDGE, WCDMA, Bluetooth, DECT, and any combination of the above and/or other communication systems.

Various embodiments of the invention may be practiced in direct modulation and/or polar modulation circuitry, which may utilize a variety of PLL designs. These PLL designs may include, for example, those utilize an integer-N PLL, or integer-N synthesizer, a fractional-N PLL, or fractional-N synthesizer, a delta-sigma fractional-N PLL, or delta-sigma fractional-N synthesizer, and/or a hybrid PLL or hybrid synthesizer. Various embodiments of the invention may also be practiced with various 2-input PLL designs.

While various embodiments of the invention may have been described with certain functionalities corresponding to certain functional blocks, the invention need not be so limited. For example, various functionalities may be grouped to different functional blocks. Accordingly, other embodiments of the invention, the accumulator 714 and the K gain block 716 may be grouped to one functional block, the noise elimination block 812 and the delay block 718 may be grouped to one functional block, and/or the noise elimination block 810 and the parametric equalizer 712 may be grouped to one functional block. Other grouping of the various parts described may be dependent on design decisions.

Aspects of a method and system for direct and polar modulation using a two input analog PLL may comprise the digital compensator 302 that enables generation of digital signals $W_n$ and $V_n$ from an input signal $U_n$ and a feedback signal $Y_n$. The digital signal $W_n$ may be processed, for example, via the signal offset block 304 to be an input to the sigma-delta modulator 309b in the fractional N PLL 306. The digital signal $V_n$ may be an input to the fractional N PLL 306, and may be used to control the capacitor bank 308a in the VCO 308. The feedback signal $Y_n$ may be an output of the ADC 310, and the feedback signal $Y_n$ may correspond to the analog feedback signal $P_r$ generated by the fractional N PLL 306. Accordingly, the digital signals $W_n$ and $V_n$ may be used to adaptively control the fractional N PLL 306.

A digital filter in the digital compensator 302, for example, the parametric equalizer 712, may provide compensation for low pass characteristics of the fractional N PLL 306 by emphasizing high frequency components of the input to the parametric equalizer 712. The digital compensator 302 may also comprise at least one delay block to compensate for delay in generating the digital signals, where the delay may comprise processing latency in the parametric equalizer 712 and the fractional N PLL 306, for example. The latency due to the fractional N PLL 306 may originate from generation of the feedback signal $P_r$.

The digital compensator 302 may also comprise a noise reduction block that may enable compensation for noise due to capacitor mismatch in, for example, the VCO 308 of the fractional N PLL 306. The compensation for noise may be applied to the digital signal $W_n$ and/or the digital signal $V_n$. The digital compensator 302 may also comprise the MSP block 722 that may enable reduction of a word length for the digital signal $V_n$ to, for example, the most significant M bits.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for processing signals in a circuit, the method comprising:
    performing, by one or more processors and/or circuits comprising a two-input analog phase locked loop and a voltage-controlled oscillator integrated within said two-input analog phase locked loop:
        generating a first digital signal and a second digital signal based on an analog feedback signal generated by said two-input analog phase locked loop, wherein said analog feedback signal is distinct from an output of said voltage-controlled oscillator; and
        digitally controlling said two-input analog phase-locked loop during direct modulation of a signal or polar modulation of said signal based on said generated first digital signal and said generated second digital signal.

2. The method according to claim 1, comprising compensating for low pass characteristic of said two-input analog phase locked loop via a digital filter.

3. The method according to claim 2, wherein said digital filter is a parametric equalizer.

4. The method according to claim 1, comprising compensating for latency resulting from generation of said first digital signal and said second digital signal.

5. The method according to claim 1, comprising compensating for latency resulting from generation of said analog feedback signal generated by said two-input analog phase locked loop.

6. The method according to claim 1, comprising compensating for noise due to capacitor mismatch in said two-input analog phase locked loop.

7. The method according to claim 6, wherein said compensation for noise is applied to said generated first digital signal.

8. The method according to claim 6, wherein said compensation for noise is applied to said generated second digital signal.

9. The method according to claim 1, comprising reducing a word length of said second digital signal.

10. The method according to claim 9, wherein said reduced word length comprises M most significant bits of said second digital signal.

11. The method according to claim 1, comprising adaptively controlling said two-input analog phase locked loop.

12. The method according to claim 1, wherein said signal is a wideband CDMA signal.

13. The method according to claim 1, comprising processing said second digital signal prior to using said second digital signal by said two-input analog phase locked loop.

14. The method according to claim 1, wherein:
    said two-input analog phase locked loop comprises a frequency divider and a loop filter; and
    said analog feedback signal is based on an output of one of said frequency divider and said loop filter.

15. A system for processing signals in a circuit, the system comprising:
    a two-input analog phase locked loop;
    a voltage-controlled oscillator integrated within said two-input analog phase locked loop; and
    a digital compensator operably coupled to said two-input analog phase locked loop that enables generation of a first digital signal and a second digital signal based on an analog feedback signal generated by said two-input analog phase locked loop, wherein:
        said analog feedback signal is distinct from an output of said voltage-controlled oscillator; and
        said digital compensator enables digitally controlling said two-input analog phase locked loop during direct modulation of a signal or polar modulation of said signal based on said generated first digital signal and said generated second digital signal.

16. The system according to claim 15, comprising a digital filter that enables compensation for low pass characteristics of said two-input analog phase locked loop.

17. The system according to claim 16, wherein said digital filter is a parametric equalizer.

18. The system according to claim 15, comprising delay circuitry that enables compensation for latency resulting from generation of said first digital signal and said second digital signal.

19. The system according to claim 15, comprising delay circuitry that enables compensation for latency resulting from generation of said analog feedback signal generated by said two-input analog phase locked loop.

20. The system according to claim 19, comprising a noise eliminator block that enables compensation for noise due to capacitor mismatch in said two-input analog phase locked loop.

21. The system according to claim 20, wherein said compensation for noise is applied to said generated first digital signal.

22. The system according to claim 20, wherein said compensation for noise is applied to said generated second digital signal.

23. The system according to claim 15, wherein said digital compensator enables reduction of a word length of said second digital signal.

24. The system according to claim 23, wherein said reduced word length comprises M most significant bits of said second digital signal.

25. The system according to claim 15, wherein said digital compensator enables adaptively controlling said two-input analog phase locked loop.

26. The system according to claim 15, wherein said signal is a wideband CDMA signal.

27. The system according to claim 15, wherein said digital compensator enables processing of said second digital signal prior to using said second digital signal by said two-input analog phase locked loop.

28. The system according to claim 15, wherein:
    said two-input analog phase locked loop comprises a frequency divider and a loop filter; and
    said analog feedback signal is based on an output of one of said frequency divider and said loop filter.

* * * * *